(12) United States Patent
Kobayashi (10) Patent No.: US 6,670,841 B2
(45) Date of Patent: Dec. 30, 2003

(54) LEVEL SHIFTING CIRCUIT (75) Inventor: Toshifumi Kobayashi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/267,666

(22) Filed: Oct. 10, 2002

(65) Prior Publication Data

US 2003/0193362 A1 Oct. 16, 2003

(30) Foreign Application Priority Data

Apr. 15, 2002 (JP) ........................... 2002-112492

(51) Int. Cl.[7] ................................. H03L 5/00
(52) U.S. Cl. ..................................... 327/333
(58) Field of Search ........................ 327/333; 326/80, 326/81

(56) References Cited

U.S. PATENT DOCUMENTS 6,002,290 A  * 12/1999  Avery et al. ............... 327/333
6,232,794 B1 *  5/2001  Cox .......................... 326/81
6,556,061 B1 *  4/2003  Chen et al. ................. 327/333

FOREIGN PATENT DOCUMENTS

JP          A 9-172368        6/1997

OTHER PUBLICATIONS

Ovens et al., US patent application Pub. No. US 2002/0024374 pub. Feb. 28, 2002, Ser. No. 09/940,957 filed Aug. 27, 2001.*

* cited by examiner

Primary Examiner—My-Trang Nu Ton
(74) Attorney, Agent, or Firm—Burns, Doane, Swecker & Mathis, LLP (57) ABSTRACT A level shifting circuit includes discharging means made up of a first high-voltage N-type transistor and a second high-voltage N-type transistor whose gates are biased respectively in a predetermined voltage and whose drains are connected to a first and second nodes respectively; and a first low-voltage N-type transistor and a second low-voltage N-type transistor whose drains are connected to sources of the first and second high-voltage N-type transistors respectively, whose gates are connected to the complementary input signal and whose sources are grounded respectively, and the predetermined voltage is set to an intermediate voltage between a threshold voltage of the first and second high-voltage N-type transistors and a breakdown voltage of the first and second low-voltage N-type transistors.

4 Claims, 10 Drawing Sheets

FIG. 10 CONVENTIONAL

FIG. 11 CONVENTIONAL

LEVEL SHIFTING CIRCUIT

BACKGROUND OF THE INVENTION

1. Field of the Invention

The present invention relates to a level shifting circuit for converting a logical level.

2. Description of Related Art

Figure 10:
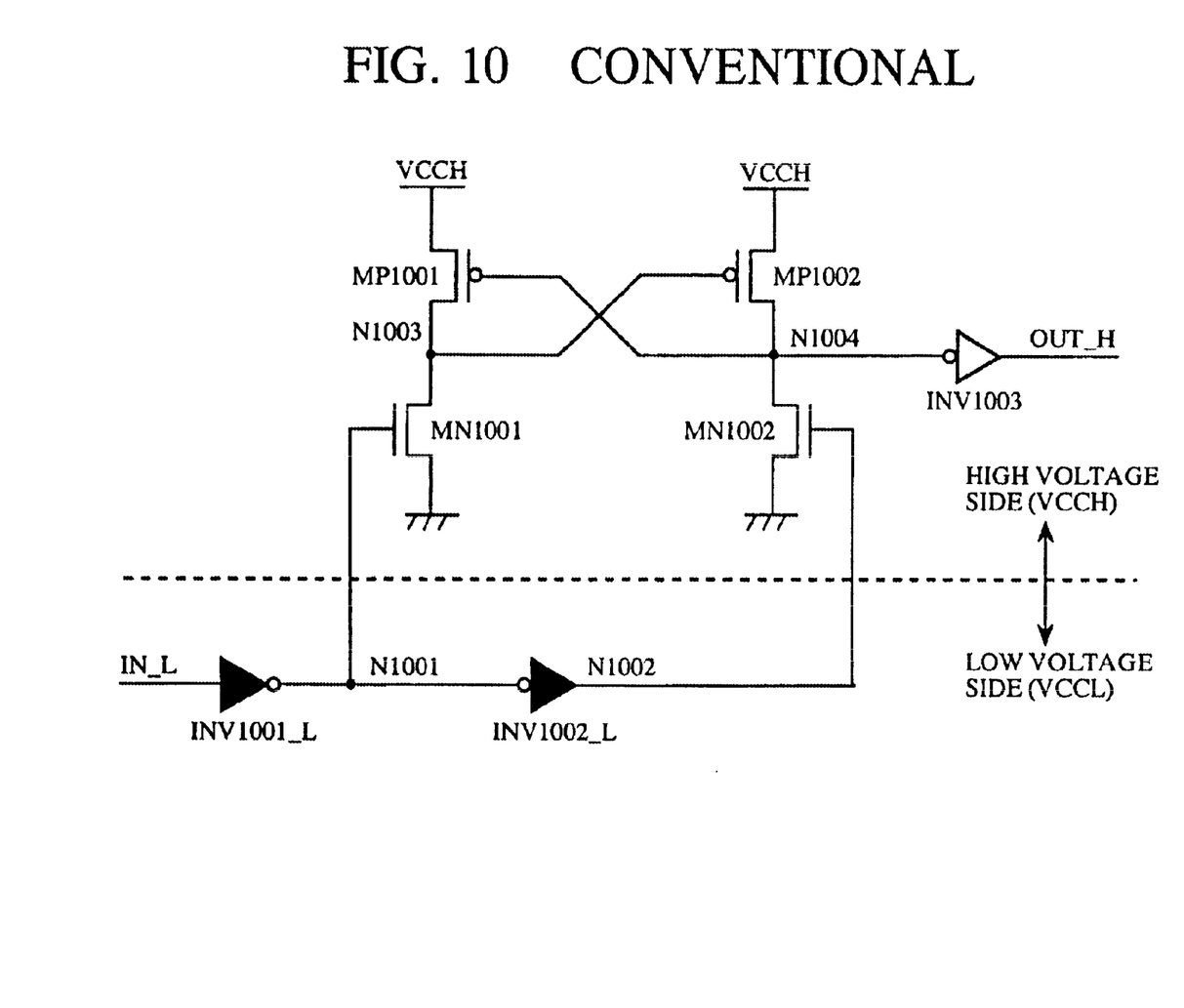
FIG. 10 is a circuit diagram to show a conventional level shifting circuit.

FIG. 10 is a circuit diagram to show a conventional level shifting circuit. In a semiconductor device using two types of voltage sources, a low voltage source (VCCL) and a high voltage source (VCCH), the level shifting circuit serves as a circuit which converts the logical level of the voltage VCCL into the logical level of the voltage VCCH (VCCL<VCCH). In FIG. 10, reference sign IN_L denotes an input signal having the logical level of the voltage VCCL, sign OUT_H denotes an output signal having the logical level of the voltage VCCH, signs INV1001_L and INV1002_L denote inverters operating by the low voltage source (VCCL), sign INV1003 denotes an inverter operating by the high voltage source (VCCH), signs MP1001 and MP1002 denote high-voltage P-type transistors and signs MN1001 and MN1002 denote high-voltage N-type transistors.

Figure 11:
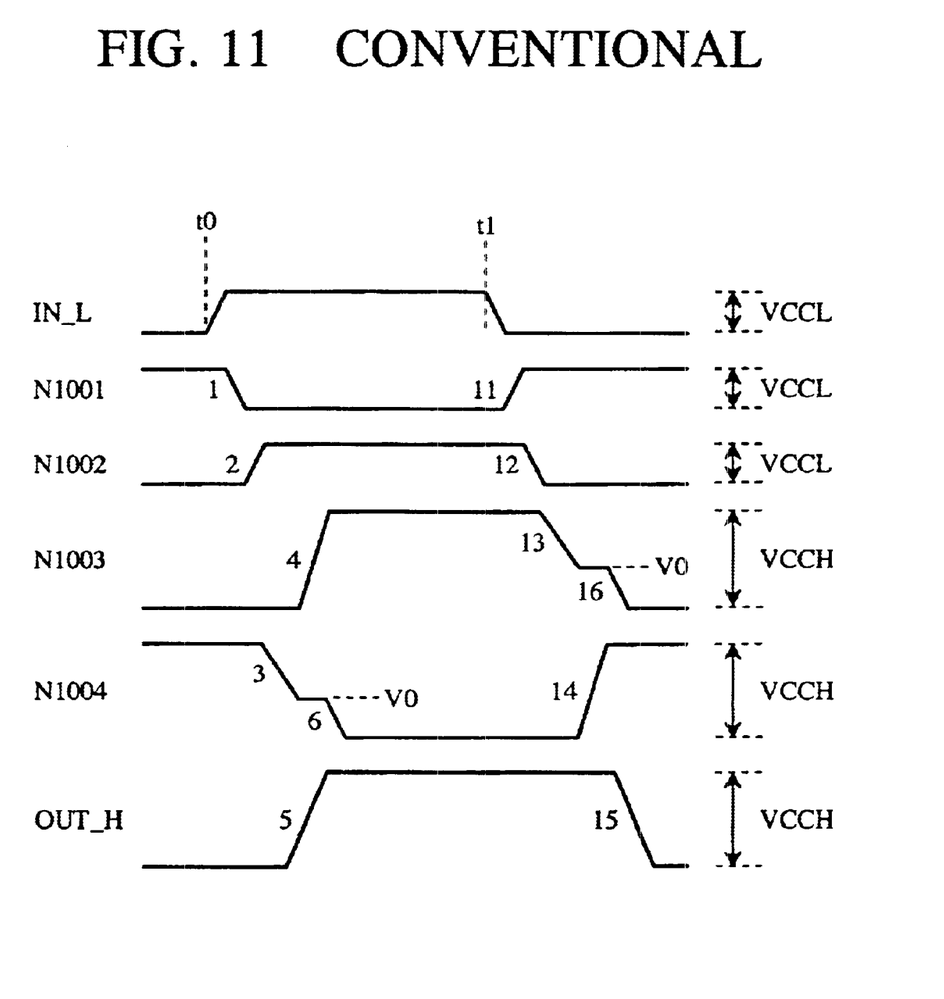
FIG. 11 is a waveform chart to show an operation of the conventional level shifting circuit.

FIG. 11 is a waveform chart to show an operation of the conventional level shifting circuit.

Next, an operation will be discussed.

The operation of the level shifting circuit shown in FIG. 10 will be discussed below, referring to the waveform chart of FIG. 11. In the following discussion, the logic High level of the voltage VCCL is represented as "H_l" level, the logic High level of the voltage VCCH is represented as "H_h" level and the logic Low level (0 V) of these voltages are represented as "L".

In a state where the input signal IN_L is stationary at the "L" level, a node N1001 has the "H_l" level and a node N1002 has the "L" level, and the high-voltage N-type transistor MN1001 is in an ON state and the high-voltage N-type transistor MN1002 is in an OFF state. Further, a node N1003 has the "L" level and a node N1004 has the "H_h" level, and the high-voltage P-type transistor MP1001 is in the OFF state and the high-voltage P-type transistor MP1002 is in the ON state. The output signal OUT_H has the "L" level.

When the input signal IN_L changes from the "L" level to the "H_l" level (t0 of FIG. 11), the node N1001 comes into the "L" level and the node N1002 comes into the "H_l" level by the operations of the inverters INV1001_L and INV1002_L (1, 2 of FIG. 11) and the high-voltage N-type transistor MN1001 comes into the OFF state and the high-voltage N-type transistor MN1002 comes into the ON state. At this time, since the high-voltage P-type transistor MP1002 remains in the ON state, the potential of the node N1004 falls to a voltage value V0 obtained by dividing the voltage VCCH by the ON-resistance of the high-voltage P-type transistor MP1002 and the ON-resistance of the high-voltage N-type transistor MN1002 (3 of FIG. 11). When the potential of the node N1064 becomes VCCH–VthP (VthP represents a threshold voltage of the high-voltage P-type transistor) or lower, the high-voltage P-type transistor MP1001 comes into the ON state and the node N1003 is charged up to the voltage VCCH (4 of FIG. 11) and when the potential of the node N1004 becomes the threshold voltage of the inverter INV1003 or lower, the out put signal OUT_H becomes "H_h" level (5 of FIG. 11). Further, since the node N1003 is charged up to the voltage VCCH, the high-voltage P-type transistor MP1002 comes into the OFF state and the node N1004 is completely discharged to 0 V (6 of FIG. 11).

When the input signal IN_L changes from the "H_l" level to the "L" level (t1 of FIG. 11), a series of operation is performed, almost like the above, where the node N1001 changes to the "H_l" level and the node N1002 changes to the "L" level (11, 12 of FIG. 11), the high-voltage N-type transistor MN1001 comes into the ON state and the high-voltage N-type transistor MN1002 comes into the OFF state, the potential of the node N1003 falls to V0 (13 of. FIG. 11), the high-voltage P-type transistor MP1002 comes into the ON state, the potential of the node N1004 rises up to the voltage VCCH (14 of FIG. 11), and then when the potential of the node N1004 becomes the threshold voltage of the inverter INV1003 or higher, the output signal OUT_H changes to the "L" level: (15 of FIG. 11) and the potential of the node N1003 changes to 0 V (16 of FIG. 11).

As discussed above, there is a case in the conventional level shifting circuit, where the high-voltage P-type transistor MP1001 and the high-voltage N-type transistor MN1001 come into the ON state at the same time or where the high-voltage P-type transistor MP1002 and the high-voltage N-type transistor MN1002 come into the ON state at the same time (3, 13 of FIG. 11), and the voltage V0 of the node N1001 or the node N1002 at that time should be VCCH–VthP or lower. Assuming that the ON-resistance of the high-voltage P-type transistor is RonP and the ON-resistance of the high-voltage N-type transistor is RonN, since V0=VCCH*RonN/(RonP+RonN), it is necessary to satisfy a relation RonP>RonN in order to set V0 to a low value to some degree. Further, assuming that the channel width of a transistor is W and the channel length thereof is L, since the ON-resistance thereof is in proportion to L/W, it is necessary to set the channel width W smaller and/or the channel length L larger in order to increase the ON-resistance and it is necessary to set the channel width W larger and/or the channel length L smaller in order to decrease the ON-resistance.

With refinement of semiconductor integrated circuits, a power supply voltage used in a semiconductor chip decreases and a difference between this power supply voltage and a power supply voltage for external output signals of the semiconductor chip is widened. The above discussed level shifting circuit is also used for, e.g., converting a logical signal of the low voltage source (VCCL) into a logical signal of the high voltage source (VCCH) for external output inside the semiconductor chip. Since a low-voltage transistor used in a circuit operating by the low voltage source (VCCL) is designed to perform an optimum operation with a low voltage and has a low breakdown voltage, there is a possibility that the low-voltage transistor may be broken when a high voltage is applied thereto. For this reason, a high-voltage transistor having a high breakdown voltage is used for a level shifting circuit connected to a high voltage source (VCCH). A threshold voltage of the high-voltage transistor is higher than that of a low-voltage transistor. When the voltage VCCL of the low voltage source becomes lower, the difference between the voltage VCCL and the threshold voltage (VthN) of the high-voltage N-type transistors MN1001 and MN1002 becomes smaller, and this leads to a problem that the high-voltage N-type transistor MN1001 or the MN1002 does not come into the ON state even if the node N1001 or the node N1002 becomes "H_l" level respectively.

Further, even when the voltage VCCL is equal to the threshold voltage (VthN) of the high-voltage N-type transistors MN1001 and MN1002 or higher, since a gate source voltage (VCCL) at the time when;the high-voltage N-type transistors MN1001 and MN1002 are in the ON state is lower than a gate-source voltage (−VCCH) at the time when the high-voltage P-type transistors MP1001 and MP1002 are in the ON state, the ON-resistance RonN of the high-voltage N-type transistor is hard to reduce even if L/W of the high-voltage N-type transistors MN1001 and MN1002 is made smaller, and this tendency is accelerated as the difference between the voltage VCCH and the voltage VCCL becomes larger. Therefore, in order to satisfy the relation RonP>RonN, it is necessary to set the ON-resistance RonP extremely high. Since the nodes N1001 and N1002 are charged by the high-voltage P-type transistors MP1001 and MP1002 (4, 14 of FIG. 11), however, the charging speed becomes lower when the ON-resistance RonP is extremely high, and this causes a problem that a delay time of the output signal OUT_H from the input signal IN_L may increase.

In contrast to this, it is possible to satisfy the relation RonP>RonN with RonP kept low to some degree by setting L/W of the high-voltage N-type transistors MN1001 and MN1002 extremely smaller than L/W of the high-voltage P-type transistors MP1001 and MP1002. Since a value (RonP+RonN) becomes small in this case, however, a through current which flows when the high-voltage P-type transistor MP1001 and the high-voltage N-type transistor MN1001 come into the ON state at the same time or the high-voltage P-type transistor MP1002 and the high-voltage N-type transistor MN1002 come into the ON state at the same time becomes large and this increases the power consumption.

SUMMARY OF THE INVENTION

The present invention is intended to solve the above described problem and it is an object of the present invention to provide a level shifting circuit which realized an increase of the potential difference allowing the logic-level conversion: and a reduction of the delay time and the through current.

In the level shifting circuit in accordance with the present invention, the discharging means is made up of a first high-voltage N-type transistor and a second high-voltage N-type transistor whose gates are biased respectively in a predetermined voltage and whose drains are connected to a first and second nodes respectively; and a first low-voltage N-type transistor and a second low-voltage N-type transistor whose drains are connected to sources of the first and second high-voltage N-type transistors respectively, whose gates are connected to the complementary input signal and whose sources are grounded respectively, and the predetermined voltage is set to an intermediate voltage between a threshold voltage of the first and second high-voltage N-type transistors and a breakdown voltage of the first and second low-voltage N-type transistors.

Therefore; according to the present invention, since gate voltages of the first and second high-voltage N-type transistors are always higher than the threshold voltage thereof and discharges of the first and second nodes are controlled by the first and second low-voltage N-type transistors, it is possible to avoid the problem that the first or second node is not discharged, even if a first voltage source becomes as low as the threshold voltage.

Further, since a voltage equal to or higher than the breakdown voltage of the first and second low-voltage N-type transistors is not applied to the drains of the first and second low-voltage N-type transistors, it is possible to avoid breakage of the first and second low-voltage N-type transistors even if a difference between a second voltage source and the first voltage source becomes larger.

Thus, the present invention produces an effect of providing a level shifting circuit which allows an increase in convertible potential difference.

DETAILED DESCRIPTION OF THE PREFERRED EMBODIMENTS

Hereafter, the preferred embodiments of the present invention will be discussed.

FIRST PREFERRED EMBODIMENT

Figure 1:
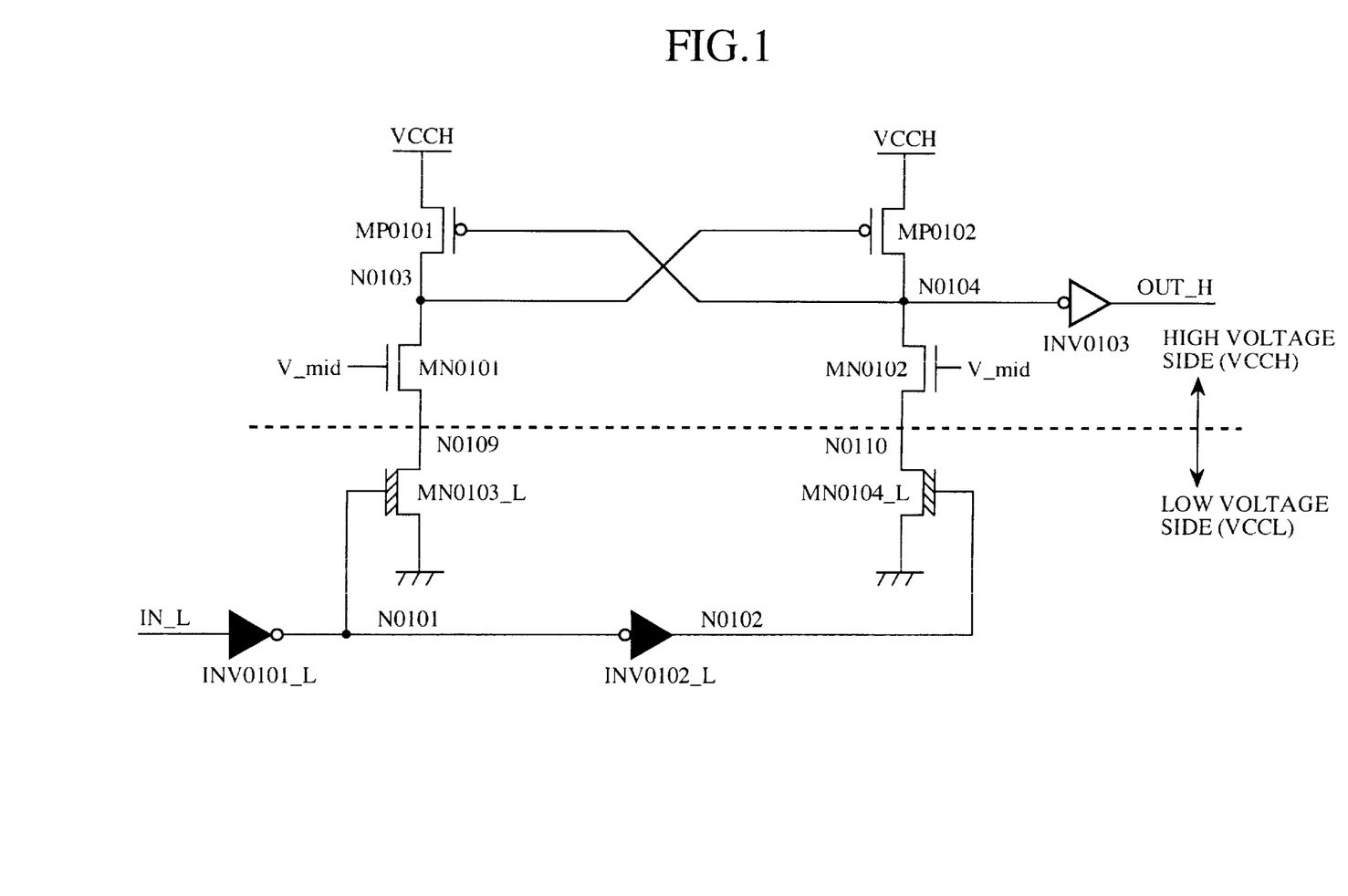
FIG. 1 is a circuit diagram to show a level shifting circuit in accordance with a first preferred embodiment of the present invention.

FIG. 1 is a circuit diagram to show a level shifting circuit in accordance with the first preferred embodiment of the present invention. In a semiconductor device using two types of voltage sources, a low voltage source (VCCL: the first voltage source) and a high voltage source (VCCH: the second voltage source); the level shifting circuit serves as a circuit which converts the logical level of the voltage VCCL into the logical level of the voltage VCCH. In FIG. 1, reference sign IN_L denotes an input signal having the logical level of the voltage VCCL and sign OUT_H denotes an output signal having the logical level of the voltage VCCH. Reference sign INV0101_L denotes an inverter operating by the low voltage source (VCCL), to which the input signal IN_L is inputted. Reference sign INV0102_L denotes an inverter operating by the low voltage source (VCCL), whose input is an output of the inverter INV0101_L (node N0101).

Reference sign MN0101 denotes a high-voltage N-type transistor (the first high-voltage N-type transistor) whose drain is connected to a node N0103 (the first node), gate is biased to a predetermined voltage V_mid and source is connected to a node N0109. Reference sign MN0103_L denotes a low-voltage N-type transistor (the first low-voltage N-type transistor) whose drain is connected to the node N0109, gate is connected to the output of the inverter INV0101_L (node N0101) and source is grounded. Reference sign MN0102 denotes a high-voltage N-type transistor (the second high-voltage N-type transistor) whose drain is connected to a node N0104 (the second node), gate is biased to the voltage V_mid and source is connected to a node N0110. Reference sign MN0104_L denotes a low-voltage N-type transistor (the second low-voltage N-type transistor) whose drain is connected to the node N0110, gate is connected to an output of an inverter INV0102_L (node N0102) and source is grounded.

Reference sign MP0101 denotes a high-voltage P-type transistor (the first high-voltage P-type transistor) whose drain is connected to the node N0103, gate is connected to the node N0104 and source is connected to the high voltage source (VCCH). Reference sign MP0102 denotes a high-voltage P-type transistor (the second high-voltage P-type transistor) whose drain is connected to the node N0104, gate is connected to the node N0103 and source is connected to the high voltage source (VCCH).

Reference INV0103 denotes an inverter operating by the high voltage source (VCCH), whose input is connected to the node N0104 and output is the output signal OUT_H.

In the present constitution, the voltage V_mid is set to a voltage higher than the threshold voltage (VthN) of the high-voltage N-type transistors MN0101 and MN0102 and lower than the breakdown voltage of the low-voltage N-type transistors MN0103_L and MN0104_L.

Thus, in the first preferred embodiment, since gate voltages of the high-voltage N-type transistors MN0101 and MN0102 are always higher than the threshold voltage (VthN) thereof and discharges of the nodes N0103 and N0104 are controlled by the low-voltage N-type transistors MN0103_L and MN0104_L, it is possible to avoid the problem that the node N0103 or the node N0104 is not discharged even if the voltage VCCL becomes as low as the threshold voltage VthN.

Further, since a voltage equal to or higher than the breakdown voltage of the low-voltage N-type transistors is not applied to the nodes N0109 nor N0110, it is possible to avoid breakage of the low-voltage N-type transistors MN0103_L and MN0104_L even if the difference between the voltage VCCH and the voltage VCCL becomes large.

Figure 2:
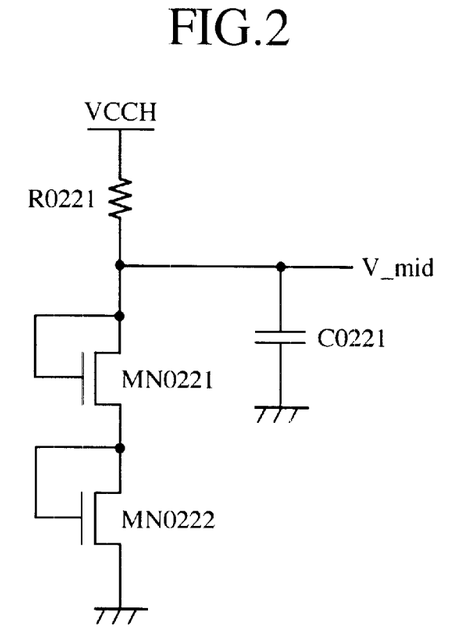
FIG. 2 is a circuit diagram to show an example of V_mid generation circuit.

FIG. 2 is a circuit diagram to show an example of V_mid generation circuit. In FIG. 2, reference sign R0221 denotes a resistor having one end connected to the high voltage source (VCCH) and the other end connected to a V_mid output terminal, sign MN0221 denotes a high-voltage N-type transistor whose drain and gate are connected to the V_mid output terminal, sign MN0222 denotes a high-voltage N-type transistor whose drain and gate are connected to a source of the high-voltage N-type transistor MN0221 and source is grounded and sign C0221 denotes decoupling capacitance connected between the V_mid output terminal and the ground. In this generation circuit, a relation V_mid 2*VthN holds.

Figure 3:
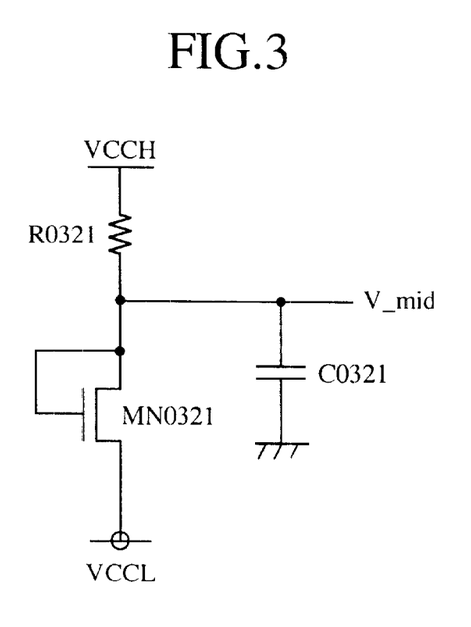
FIG. 3 is a circuit diagram to show another example of V_mid generation circuit.

FIG. 3 is a circuit diagram to show another example of V_mid generation circuit. In FIG. 3, reference sign R0321 denotes a resistor having one end connected to the high voltage source (VCCH) and the other end connected to the V_mid output terminal, sign MN0321 denotes a high-voltage N-type transistor whose drain and gate are connected to the V_mid output terminal and source is connected to the low voltage source (VCCL) and sign C0321 denotes decoupling capacitance connected between the V_mid output terminal and the ground. In this generation circuit, a relation V_mid VCCL+VthN holds.

SECOND PREFERRED EMBODIMENT

Figure 4:
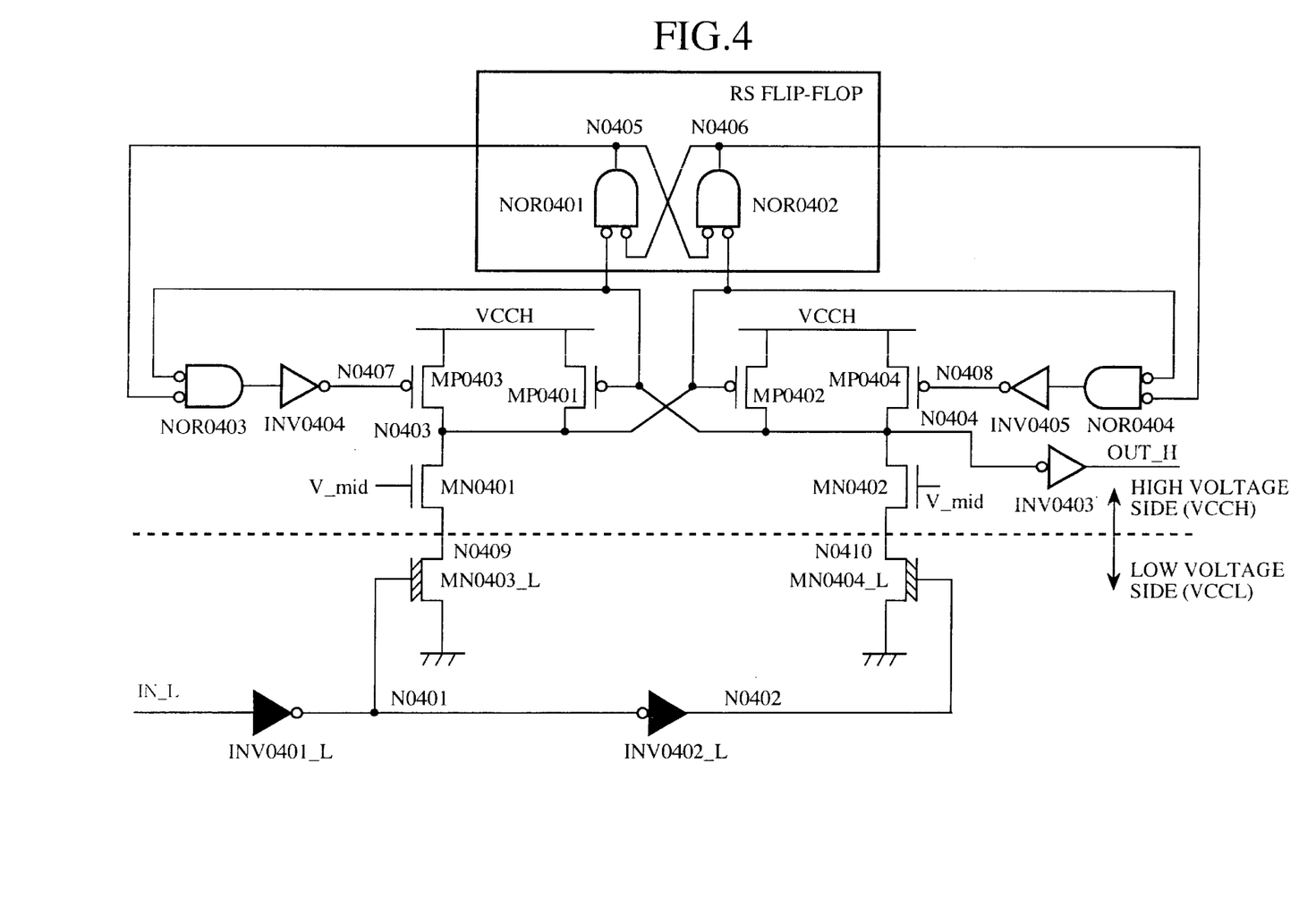
FIG. 4 is a circuit diagram to show a level shifting circuit in accordance with a second preferred embodiment of the present invention.

FIG. 4 is a circuit diagram to show a level shifting circuit in accordance with the second preferred embodiment of the present invention. In a semiconductor device using two types of voltage sources, the low voltage source (VCCL) and the high voltage source (VCCH), the level shifting circuit serves as a circuit which converts the logical level of the voltage VCCL into the logical level of the voltage VCCH. In FIG. 4, reference sign IN_L denotes the input signal having the logical level of the voltage VCCL and sign OUT_H denotes the output signal having the logical level of the voltage VCCH. Reference sign INV0401_L denotes an inverter operating by the low voltage source (VCCL), to which the input signal IN_L is inputted. Reference sign INV0402_L denotes an inverter operating by the low voltage source (VCCL), whose input is an output of the inverter INV0401_L (node N0401).

Reference sign MN0401 denotes a high-voltage N-type transistor whose drain is connected to a node N0403, gate is biased to the predetermined voltage V_mid and source is connected to a node N0409. Reference sign MN0403_L denotes a low-voltage N-type transistor whose drain is connected to the node N0409, gate is connected to the output of the inverter INV0401_L (node N0401) and source is grounded. Reference sign MN0402 denotes a high-voltage N-type transistor whose drain is connected to a node N0404, gate is biased to the voltage V_mid and source is connected to a node N0410. Reference sign MN0404_L denotes a low-voltage N-type transistor whose drain is connected to the node N0410, gate is connected to an output of an inverter INV0402_L (node N0402) and source is grounded.

Reference sign MP0401 denotes a high-voltage P-type transistor whose drain is connected to the node N0403, gate is connected to the node N0404 and source is connected to the high voltage source (VCCH). Reference sign MP0402 denotes a high-voltage P-type transistor whose drain is connected to the node N0404, gate is connected to the node N0403 and source is connected to the high voltage source (VCCH). Reference sign MP0403 denotes a high-voltage P-type transistor (the first switching circuit, the third high-voltage P-type transistor) connected in parallel to the high-voltage P-type transistor MP0401, and sign MP0404 denotes a high-voltage P-type transistor (the second switching circuit, the fourth high-voltage P-type transistor) connected in parallel to the high-voltage P-type transistor MP0402.

Reference signs NOR0401 and NOR0402 denote NOR gates (the first and second NOR gates) operating by the high voltage source (VCCH), whose respective outputs (node N0405 and node N0406) are connected to gate inputs of the other NOR gates, to form a RS flip-flop (charging regulator circuit). An input of this RS flip-flop on the side of NOR gate NOR0401 is connected to the node N0404 and an input on the side of NOR gate NOR0402 is connected to the node N0403. Reference sign NOR0403 denotes a NOR gate (charging regulator circuit, the third NOR gate) operating by the high voltage source (VCCH), whose input is connected to the nodes N0404 and N0405. Reference sign INV0404 denotes an inverter (charging regulator circuit, the first inverter) operating by the high voltage source (VCCH), whose input is connected to an output of the NOR gate NOR0403 and output is connected to a gate of the high-voltage P-type transistor MP0403 (node N0407). Reference sign N0404 denotes a NOR gate (charging regulator circuit, the fourth NOR gate) operating by the high voltage source (VCCH), whose input is connected to the nodes N0403 and N0406. Reference sign INV0405 denotes an inverter (charging regulator circuit, the second inverter) operating by the high voltage source (VCCH), whose input is connected to an output of the NOR gate NOR0401 and output is connected to a gate of the high-voltage P-type transistor MP0404 (node N0408).

Reference sign INV0403 denotes an inverter operating by the high voltage source (VCCH), whose input is connected to the node N0404 and output is the output signal OUT_H.

In the present constitution, the voltage V_mid is set to a voltage higher than the threshold voltage (VthN) of the high-voltage N-type transistors MN0401 and MN0402 and lower than the breakdown voltage of the low-voltage N-type transistors MN0403_L and MN0404_L.

Further, the ON-resistances of the high-voltage P-type transistors MP0401 and MP0402 are set extremely high and the ON-resistances of the high-voltage P-type transistors MP0403 and MP0404 are set to a value which allows the nodes N0403 and N0404 to be charged at an adequate speed. The ON-resistances of the high-voltage N-type transistors MN0401 and MN0402 and the low-voltage N-type transistors MN0403_L and MN0404_L are set to a value which allows the nodes N0403 and N0404 to be discharged at an adequate speed.

Figure 5:
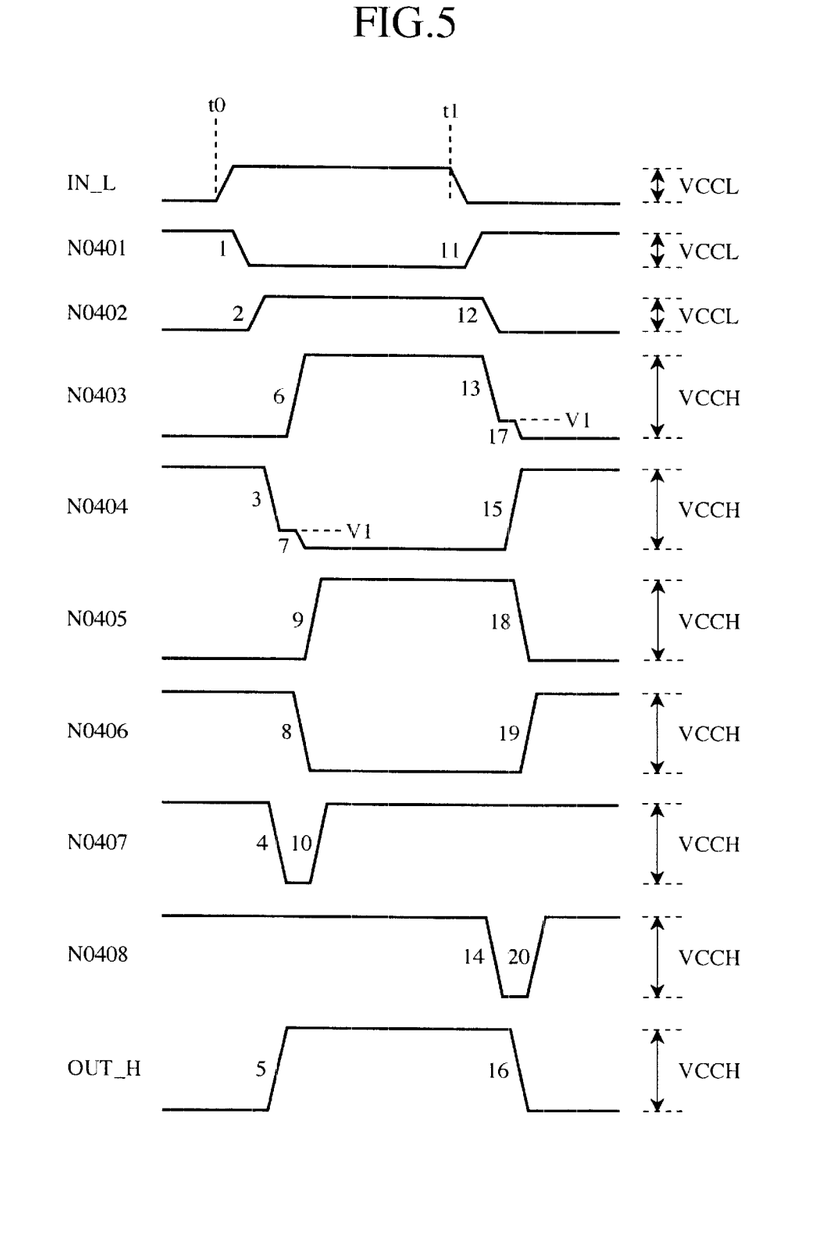
FIG. 5 is a waveform chart to show an operation of the level shifting circuit in accordance with the second preferred embodiment of the present invention.

FIG. 5 is a waveform chart to show an operation of the level shifting circuit in accordance with the second preferred embodiment of the present invention.

Next, an operation will be discussed.

The operation of the discussed-above level shifting circuit will be discussed below, referring to the waveform chart of FIG. 5.

In a state where the input signal IN_L is stationary at the "L" level, the node N0401 has the "H_l" level and the node N0402 has the "L" level, and the low-voltage N-type transistor MN0403_L is in an ON state and the low-voltage N-type transistor MN0404_L is in an OFF state. Further, the node N0403 has the "L" level and the node N0404 has the "H_h" level, and the high-voltage P-type transistor MP0401 is in the OFF state and the high-voltage P-type transistor MP0402 is in the ON state. The output signal OUT_H has the "L" level. In the RS flip-flop consisting of the NOR gates NOR0401 and NOR0402, the node N0405 is set to the "L" level and the node N0406 is set to the "H_h" level. Gates of the high-voltage P-type transistors MP0403 and MP0404 (node N0407 and node N0408) both have the "H_h" level and the high-voltage P-type transistors MP0403 and MP0404 are in the OFF state.

When the input signal IN_L changes from the "L" level to the "H_l" level (t0 of FIG. 5), the node N0401 comes into the "L" level and the node N0402 comes into the "H_l" level by the operations of the inverters INV0401_L and INV0402_L (1, 2 of FIG. 5) and the low-voltage N-type transistor MN0403_L comes into the OFF state and the low-voltage N-type transistor MN0404_L comes into the ON state. At this time, since the high-voltage P-type transistor MP0402 remains in the ON state, the potential of the node N0404 falls to a voltage value V1 obtained by dividing the voltage VCCH by the ON-resistance of the high-voltage P-type transistor MP0402 and the sum of the ON-resistances of the high-voltage N-type transistor MN0402 and the low-voltage N-type transistor MN0404_L which are connected in series to each other (3 of FIG. 5). When the potential of the node N0404 becomes the threshold voltage of the NOR gate NOR0403 or lower, the node N0407 comes into the "L" level (4 of FIG. 5) and when the potential of the node N0404 becomes the threshold voltage of the inverter INV0403 or lower, the output signal OUT_H becomes "H_h" level (5 of FIG. 5). When the node N0407 comes into the "L" level, the high-voltage P-type transistor MP0403 comes into the ON state and the node N0403 is charged up to the voltage VCCH (6 of FIG. 5). When the node N0403 comes into the "H_h" level, the high-voltage P-type transistor MP0402 comes into the OFF state and the node N0404 is completely discharged to 0 V (7 of FIG. 5) and in the RS flip-flop consisting of the NOR gates NOR0401 and NOR0402, the node N0405 is set to the "H_h" level and the node N0406 is set to the "L" level (8, 9 of FIG. 5). When the node N0405 comes into the "H_h" level, the node N0407 comes into the "H_h" level and the high-voltage P-type transistor MP0403 comes into the OFF state (10 of FIG. 5). Since the high-voltage P-type transistor MP0401 is in the ON-state at the time when the potential of the node N0404 becomes VCCH−VthP (VthP represents the threshold voltage of the high-voltage P-type transistor) or lower (3 of FIG. 5), the "H_h" level of the node N0403 is kept. The above is a series of operation of the level shifting circuit, which is caused by the change of the input signal IN_L from the "L" level to the "H_l" level.

An operation in the case where the input signal IN_L changes from the "H_l" level to the "L" level (t1 of FIG. 5) is the same as above, and potential changes of the respective nodes are shown by 11 to 20 of FIG. 5.

Thus, in the second preferred embodiment, since gate voltages of the high-voltage N-type transistors MN0401 and MN0402 are always higher than the threshold voltage (VthN) thereof and discharges of the nodes N0403 and N0404 are controlled by the low-voltage N-type transistors MN0403_L and MN0404_L, it is possible to avoid the problem that the node N0403 or the node N0404 is not discharged even if the voltage VCCL becomes as low as the threshold voltage VthN. Further, since a voltage equal to or higher than the breakdown voltage of the low-voltage N-type transistors is not applied to the nodes N0409 nor N0410, it is possible to avoid breakage of the low-voltage N-type transistors MN0403_L and MN0404_L even if the difference between the voltage VCCH and the voltage VCCL becomes large.

Further, since the ON-resistances of the high-voltage P-type transistors MP0401 and MP0402 are set extremely high, the through current which flows when the high-voltage P-type transistor MP0401, the high-voltage N-type transistor MN0401 and the low-voltage N-type transistor MN0403_L come into the ON state at the same time or when the high-voltage P-type transistor MP0402, the high-voltage N-type transistor MN0402 and the low-voltage N-type transistor MN0404_L come into the ON state at the same time can be made extremely small. Moreover, even when the difference between the voltage VCCL and the voltage VCCH becomes large, it is possible to reduce the value of V1. Further, since no through current flows through the high-voltage P-type transistors MP0403 and MP0404 for charging the nodes N0403 and N0404, it is possible to optimize the ON-resistances thereof with a high priority given to charging speed and avoid an increase in delay time caused by lower power consumption.

THIRD PREFERRED EMBODIMENT

Figure 6:
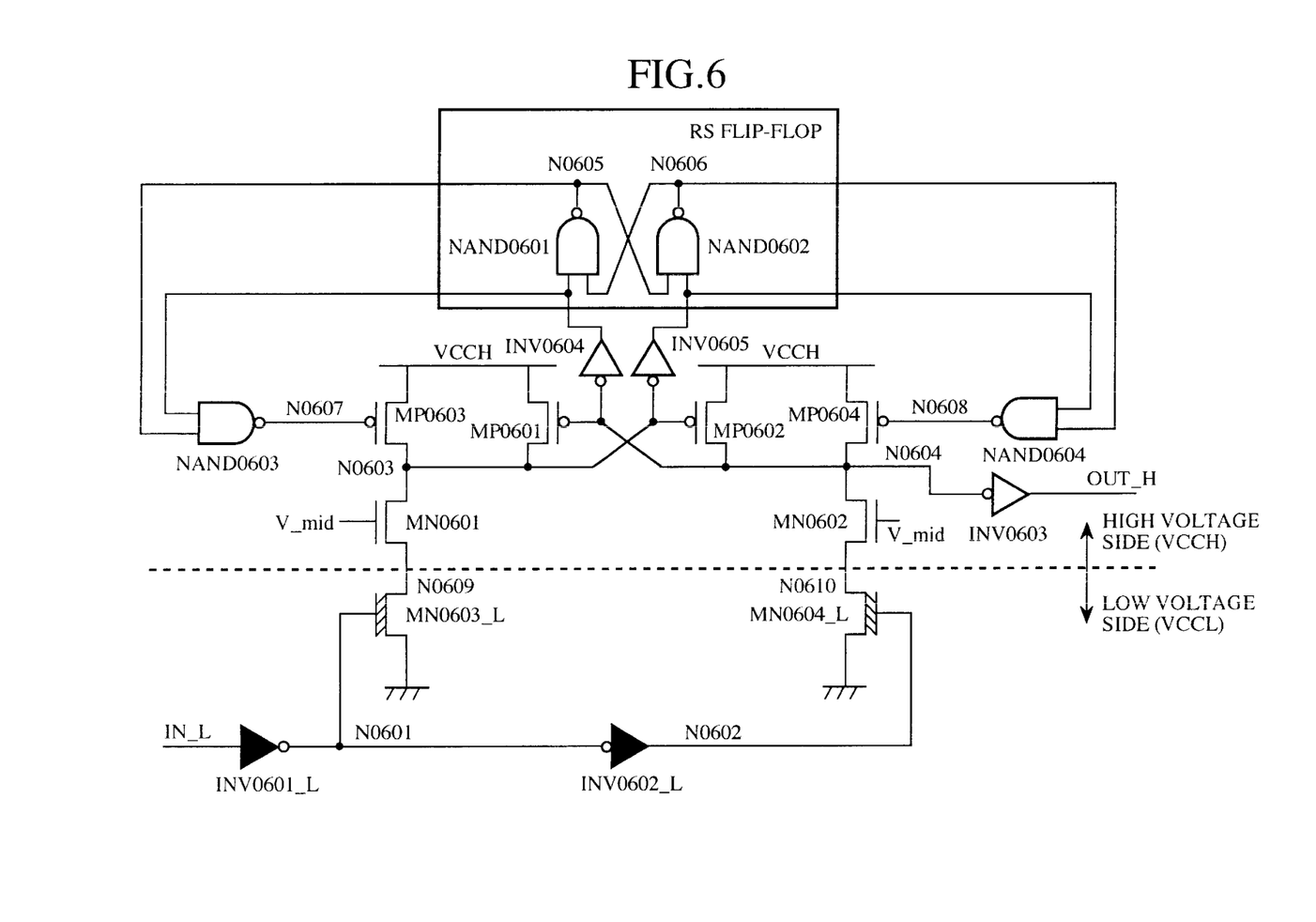
FIG. 6 is a circuit diagram to show a level shifting circuit in accordance with a third preferred embodiment of the present invention.

FIG. 6 is a circuit diagram to show a level shifting circuit in accordance with the third preferred embodiment of the present invention. In the third preferred embodiment, the NOR gates which are constituents of the second preferred embodiment are replaced by NAND gates.

In a semiconductor device using two types of voltage sources, the low voltage source (VCCL).and the high voltage source (VCCH), the level shifting circuit serves as a circuit which converts the logical level of the voltage VCCL into the logical level of the voltage VCCH. In FIG. 6 reference sign IN_L denotes the input signal having the logical level of the voltage VCCL and sign OUT_H denotes the output signal having the logical level of the voltage VCCH. Reference sign INV0601_L denotes an inverter operating by the low voltage source (VCCL), to which the input signal IN_L is inputted. Reference sign INV0602_L denotes an inverter operating by the low voltage source (VCCL), whose input is an output of the inverter INV0601_L (node N0601).

Reference sign MN0601 denotes a high-voltage N-type transistor whose drain is connected to a node N0603, gate is biased to the predetermined voltage V_mid and source is connected to a node N0609. Reference sign MN0603_L denotes a low-voltage N-type transistor whose drain is connected to the node N0609, gate is connected to the output of the inverter INV0601_L (node N0601) and source is grounded. Reference sign MN0602 denotes a high-voltage N-type transistor whose drain is connected to a node N0604, gate is biased to the voltage V_mid and source is connected to a node N0610. Reference sign. MN0604_L denotes a low-voltage N-type transistor whose drain is connected to the node N0610, gate is connected to an output of an inverter INV0602_L (node N0602) and source is grounded.

Reference sign MP0601 denotes a high-voltage P-type transistor whose drain is connected to the node N0603, gate is connected to the node N0604 and source is connected to the high voltage source (VCCH). Reference sign MP0602 denotes a high-voltage P-type transistor (the third high-voltage P-type transistor) whose drain is connected to the node N0604, gate is connected to the node N0603 and source is connected to the high voltage source (VCCH). Reference sign MP0603 denotes a high-voltage P-type transistor connected in parallel to the high-voltage P-type transistor MP0601, and sign MP0604 denotes a high-voltage P-type transistor (the fourth high-voltage P-type transistor) connected in parallel to the high-voltage P-type transistor MP0602. Reference signs INV0604 and INV0605 denote inverters (charging regulator circuit, the first and second inverters) whose inputs are connected to the nodes N0604 and N0603 respectively, operating by the high voltage source (VCCH). Reference signs NAND0601 and NAND0602 denote NAND gates (the first and second NAND gates) operating by the high voltage source (VCCH) and the respective outputs (node N0605 and node N0606) are connected to gate inputs of the other NAND gates, to form a RS flip-flop. An input of this RS flip-flop on the side of NAND gate NAND0601 is connected to an output of the inverter INV0604 and an input on the side of NAND gate NAND0602 is connected to an output of the inverter INV0605. Reference sign NAND0603 denotes a NAND gate (the third NAND gate) operating by the high voltage source, (VCCH), whose input is connected to an output of the inverter INV0604 and the node N0605 and output is connected to a gate of the high-voltage P-type transistor MP0603 (node N0607). Reference sign NAND0604 denotes a NAND gate (the fourth NAND gate) operating by the high voltage source (VCCH), whose input is connected to an output of the inverter INV0605 and the node N0606 and output is connected to a gate of the high-voltage P-type transistor MP0604 (node N0608)

Reference sign INV0603 denotes an inverter operating by the high voltage source (VCCH), whose input is connected to the node N0604 and output is the output signal OUT_H.

In the present constitution, the voltage V_mid is set to a voltage higher than the threshold voltage (VthN) of the high-voltage N-type transistors MN0601 and MN0602 and lower than the breakdown voltage of the low-voltage N-type transistors MN0603_L and MN0604_L. Further, the ON-resistances of the high-voltage P-type transistors MP0601 and MP0602 are set extremely high and the ON-resistances of the high-voltage P-type transistors MP0603 and MP0604 are set to a value which allows the nodes N0603 and N0604 to be charged at an adequate speed. The ON-resistances of the high-voltage N-type transistors MN0601 and MN0602 and the low-voltage N-type transistors MN0603_L and MN0604_L are set to a value which allows the nodes N0603 and N0604 to be discharged at an adequate speed.

Figure 7:
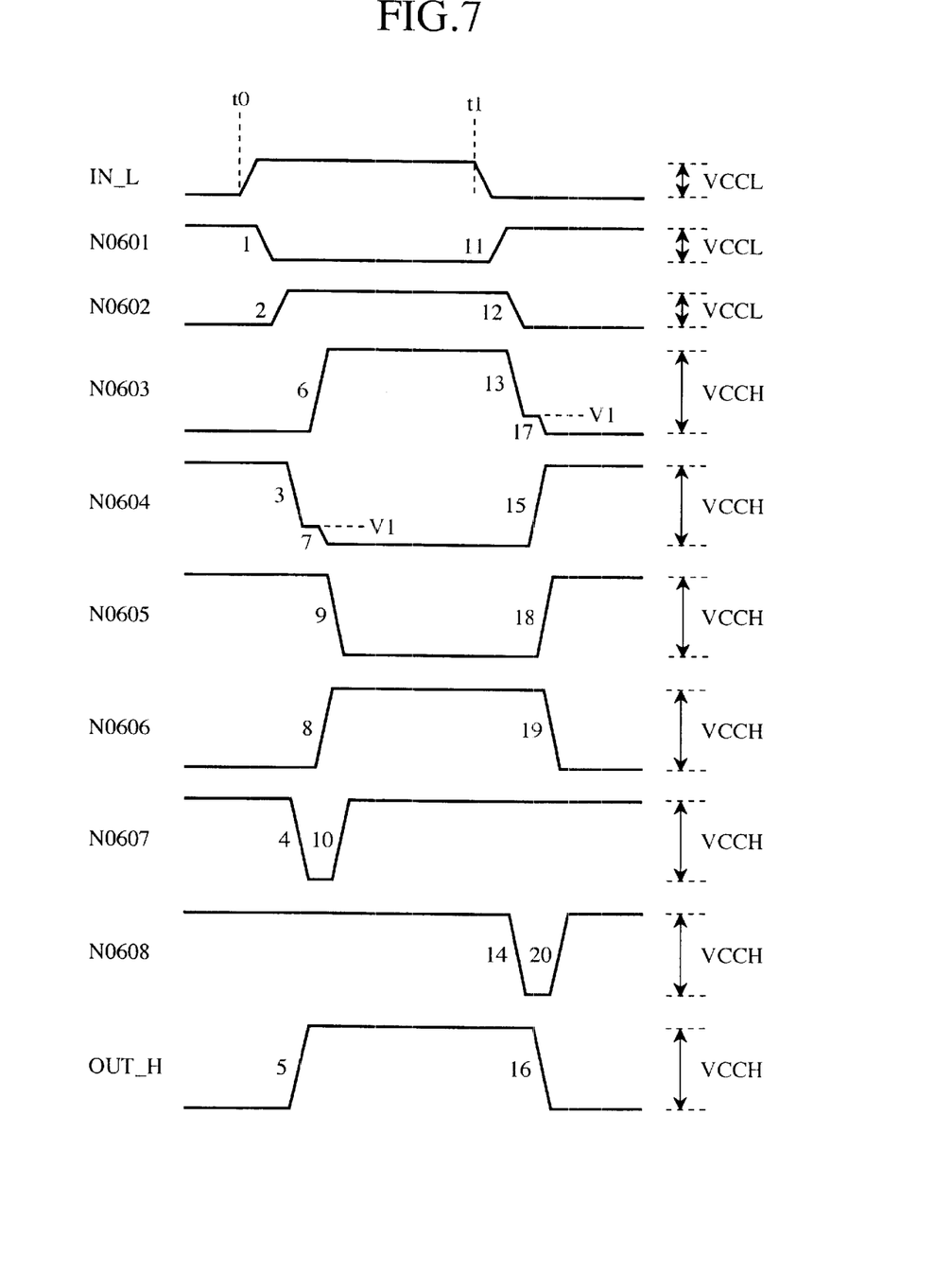
FIG. 7 is: a waveform chart to show an operation of the level shifting circuit in accordance with the third preferred embodiment of the present invention.

FIG. 7 is a waveform chart to show an operation of the level shifting circuit in accordance with the third preferred embodiment of the present invention.

Next, an operation will be discussed.

The operation of the discussed-above level shifting circuit will be discussed below, referring to FIG. 7.

In a state where the input signal IN_L is stationary at the "L" level, the node N0601 has the "H_l" level and the node N0602 has the "L" level, and the low-voltage N-type transistor MN0603_L is in the ON state and the low-voltage N-type transistor MN0604_L is in the OFF state. Further, the node N0603 has the "L" level and the node N0604 has the "H_h" level, and the high-voltage P-type transistor MP0601 is in the OFF state and the high-voltage P-type transistor MP0602 is in the ON state. The output signal OUT_H has the "L" level. In the RS flip-flop consisting of the NAND gates NAND0601 and NAND0602, the node N0605 is set to the "H_h" level and the node N0606 is set to the "L" level. Gates of the high-voltage P-type transistors MP0603 and MP0604 (node N0607 and node N0608) both have the "H_h" level and the high-voltage P-type transistors MP0603 and MP0604 are in the OFF state.

When the input signal IN_L changes from the "L" level to the "H_l" level (t0 of FIG. 7), the node N0601 comes into the "L" level and the node N0602 comes into the "H_l" level by the operations of the inverters INV0601_L and INV0602_L (1, 2 of FIG. 7) and the low-voltage N-type transistor MN0603_L comes into the OFF state and the low-voltage N-type transistor MN0604_L comes into the ON state. At this time, since the high-voltage P-type transistor MP0602 remains in the ON state, the potential of the node N0604 falls to a voltage value V1 obtained by dividing the voltage VCCH by the ON-resistance of the high-voltage P-type transistor MP0602 and the sum of the ON-resistances of the high-voltage N-type transistor MN0602 and the low-voltage N-type transistor MN0604_L which are connected in series to each other (3 of FIG. 7). When the potential of the node N0604 becomes the threshold voltage of the inverter INV0604 or lower, the node N0607 comes into the "L" level (4 of FIG. 7) and when the potential of the node N0604 becomes the threshold voltage of the inverter INV0603 or lower, the output signal OUT_H becomes "H_h" level (5 of FIG. 7). When the node N0607 comes into the "L" level, the high-voltage P-type transistor MP0603 comes into the ON state and the node N0603 is charged up to the voltage VCCH (6 of FIG. 7). When the node N0603 comes into the "H_h" level, the high-voltage P-type transistor MP0602 comes into the OFF state and the node N0604 is completely discharged to 0 V (7 of FIG. 7), and in the RS flip-flop consisting of the NAND gates NAND0601 and NAND0602, the node N0605 is set to the "L" level and the node N0606 is set to the "H_h" level (8, 9 of FIG. 7). When the node N0605 comes into the "L" level, the node N0607 comes into the "H_h" level and the high-voltage P-type transistor MP0603 comes into the OFF state (10 of FIG. 7). Since the high-voltage P-type transistor MP0601 is in the ON state at the time when the potential of the node N0604 becomes VCCH−VthP (VthP represents the threshold voltage of the high-voltage P-type transistor) or lower (3 of FIG. 7), the "H_h" level of the node N0603 is kept. The above is a series of operation of the level shifting circuit, which is caused by the change of the input signal IN_L from the "L" level to the "H_l" level.

An operation in the case where the input signal IN_L changes from the "H_l" level to the "L" level (t1 of FIG. 7) is the same as above, and potential changes of the respective nodes are shown by 11 to 20 of FIG. 7.

Thus, in the third preferred embodiment, since gate voltages of the high-voltage N-type transistors MN0601 and MN0602 are always higher than the threshold voltage (VthN) thereof and discharges of the nodes N0603 and N0604 are controlled by the low-voltage N-type transistors MN0603_L and MN0604_L, it is possible to avoid the problem that the node N0603 or the node N0604 is not discharged even if the voltage VCCL becomes as low as the threshold voltage VthN. Further, since a voltage equal, to or higher than the breakdown voltage of the low-voltage N-type transistors is not applied to the nodes N0609 nor N0610, it is possible to avoid breakage of the low-voltage N-type transistors MN0603_L and MN0604_L even if the difference between the voltage VCCH and the voltage VCCL becomes large.

Further, since the ON-resistances of the high-voltage P-type transistors MP0601 and MP0602 are set extremely high, the through current which flows when the high-voltage P-type transistor MP0601, the high-voltage N-type transistor MN0601 and the low-voltage N-type transistor MN0603_L come into the ON state at the same time or when the high-voltage P-type transistor MP0602, the high-voltage N-type transistor MN0602 and the low-voltage N-type transistor MN0604_L come into the ON state at the same time can be made extremely small. Moreover, even when the difference between the voltage VCCL and the voltage VCCH becomes large, it is possible to reduce the value of V1. Further, since no through current flows through the high-voltage P-type transistors MP0603 and MP0604 for charging the nodes N0603 and N0604, it is possible to optimize the ON-resistances thereof with a high priority given to charging speed and avoid an increase in delay time caused by lower power consumption.

FOURTH PREFERRED EMBODIMENT

Figure 8:
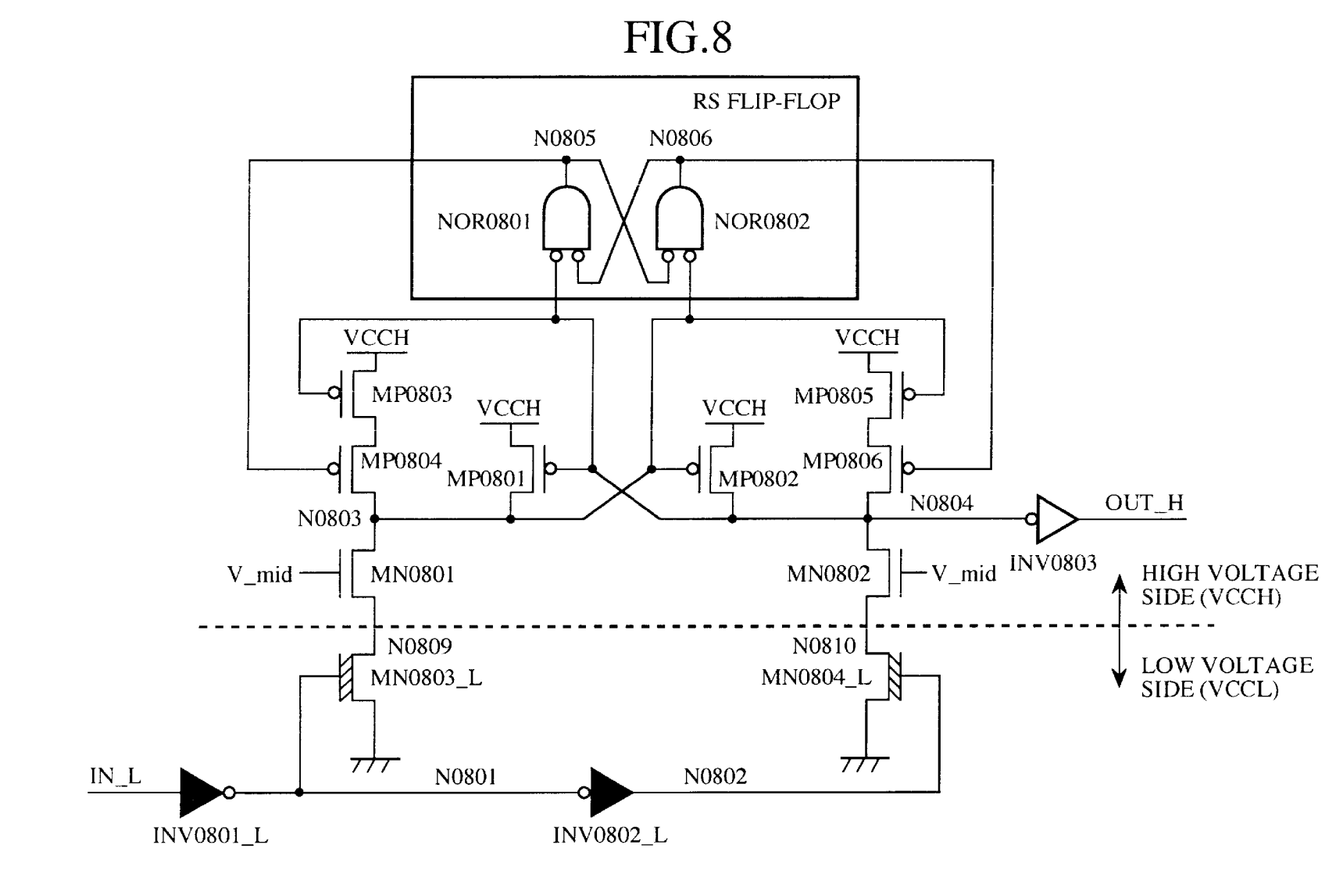
FIG. 8 is a circuit diagram to show a level shifting circuit in accordance with a fourth preferred embodiment of the present invention.

FIG. 8 is a circuit diagram to show a level shifting circuit in accordance with the fourth preferred embodiment of the present invention. In the fourth preferred embodiment, the logic gates which are constituents of the second preferred embodiment are reduced.

In a semiconductor device using two types of voltage sources, the low voltage source (VCCL) and the high voltage source (VCCH), the level shifting circuit serves as a circuit which converts the logical level of the voltage VCCL into the logical level of the voltage VCCH. In FIG. 8, reference sign IN_L denotes the input signal having the logical level of the voltage VCCL and sign OUT_H denotes the output signal having the logical level of the voltage VCCH. Reference sign INV0801_L denotes an inverter operating by the low voltage source (VCCL), to which the input signal IN_L is inputted. Reference sign INV0802_L denotes an inverter operating by the low voltage source (VCCL), whose input is an output of the inverter INV0801_L (node N0801).

Reference sign MN0801 denotes a high-voltage N-type transistor whose drain is connected to a node N0803, gate is biased to the predetermined voltage V_mid and source is connected to a node N0809. Reference sign MN0803_L denotes a low-voltage N-type transistor whose drain is connected to the node N0809, gate is connected to the output of the inverter INV0801_L (node N0801) and source is grounded. Reference sign MN0802 denotes a high-voltage N-type transistor whose drain is connected to a node N0804, gate is biased to the voltage V_mid and source is connected to a node N0810. Reference sign MN0804_L denotes a low-voltage N-type transistor whose drain is connected to the node N0810, gate is connected to an output of an inverter INV0802_L (node N0802) and source is grounded. Reference sign MP0801 denotes a high-voltage P-type transistor whose drain is connected to the node N0803, gate is connected to the node N0804 and source is connected to the high voltage source (VCCH). Reference sign MP0802 denotes a high-voltage P-type transistor whose drain is connected to the node N0804, gate is connected to the node N0803 and source is connected to the high voltage source (VCCH). Reference signs NOR0801 and NOR0802 denote NOR gates operating by the high voltage source (VCCH), whose respective outputs (node N0805 and node N0806) are connected to gate inputs of the other NOR gates, to form a RS flip-flop. An input of this RS flip-flop on the side of NOR gate NOR0801 is connected to the node N0804 and an input on the side of NOR gate NOR0802 is connected to the node N0803. Reference signs MP0803 and MP0804 denote high-voltage P-type transistors (the first switching circuit, the third and fourth high-voltage P-type transistors) which are inserted, being connected in series to each other, between the high voltage source (VCCH) and the node N0803, and a gate of the high-voltage P-type transistor MP0803 is connected to the node N0804 and a gate of the high-voltage P-type transistor MP0804 is connected to the node N0805. Reference signs MP0805 and MP0806 denote high-voltage P-type transistors (the second switching circuit, the fifth and sixth high-voltage P-type transistors) which are inserted, being connected in series to each other, between the high voltage source (VCCH) and the node N0804, and a gate of the high-voltaqe P-type transistor MP0805 is connected to the node N0803 and a gate of the high-voltage P-type transistor MP0806 is connected to the node N0806.

Reference sign INV0803 denotes an inverter operating by the high voltage source (VCCH), whose input is connected to the node N0804 and output is the output signal OUT_H.

In the present constitution, the voltage V_mid is set to a voltage higher than the threshold voltage (VthN) of the high-voltage N-type transistors MN0801 and MN0802 and lower than the breakdown voltage of the low-voltage N-type transistors MN0803_L and MN0804_L. Further, the ON-resistances of the high-voltage P-type transistors MP0801 and MP0802 are set extremely high. The ON-resistances of the high-voltage P-type transistors MP0803 and MP0804 are set to a value which allows the node N0803 to be charged at an adequate speed, and the,ON-resistances of the high-voltage P-type transistors MP0805 and MP0806 are set to a value which allows the node N0806 to be charged at an adequate speed. The ON-resistances of the high-voltage N-type transistors MN0801 and MN0802 and the low-voltage N-type transistors MN0803_L and MN0804_L are set to a value which allows the nodes N0803 and N0804 to be discharged at an adequate speed.

Figure 9:
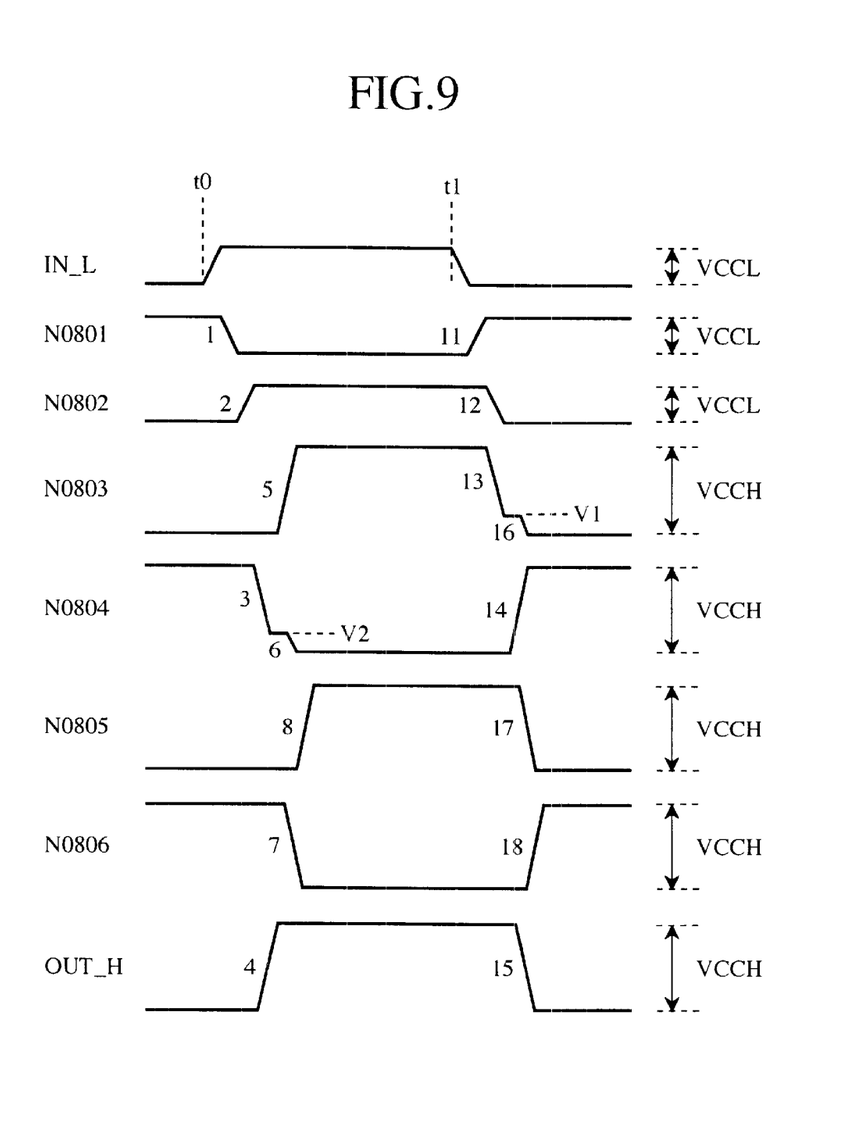
FIG. 9 is a waveform chart to show an operation of the level shifting circuit in accordance with the fourth preferred embodiment of the present invention.

FIG. 9, is a waveform chart to show an operation of the level shifting circuit in accordance with the fourth preferred embodiment of the present invention.

Next, an operation will be discussed.

The operation of the discussed-above level shifting circuit will be discussed below, referring to the waveform chart of FIG. 9.

In a state where the input signal IN_L is stationary at the "L" level, the node N0801 has the "H_l" level and the node N0802 has the "L" level, and the low-voltage N-type transistor MN0803—L is in the ON state and the low-voltage N-type transistor MN0804_L is in the OFF state. Further, the node N0803 has the "L" level and the node N0804 has the "H_h" level, and the high-voltage P-type transistor MP0801 is in the OFF state and the high-voltage P-type transistor MP0802 is in the ON state. The output signal OUT_H has the "L" level. In the RS flip-flop consisting of the NOR gates NOR0801 and NOR0802, the node N0805,is set to the "L" level and the node N0806 is set to the "H_h" level. At this time, the high-voltage P-type transistor MP0803 is in the OFF state and the high-voltage P-type transistor MP0804 is in the ON state, which are connected in series to each other, and the high-voltage P-type transistor MP0805 is in the ON state and the high-voltage P-type transistor MP0806 is in the OFF state, which are connected in series to each other.

When the input signal IN_L changes from the "L" level to the "H_l" level (t0 of FIG. 9), the node N0801 comes into the "L" level and the node N0802 comes into the "H_l" level by the operations of the inverters INV0801_L and INV0802_L (1, 2 of FIG. 9) and the low-voltage N-type transistor MN0803_L comes into the OFF state and the low-voltage N-type transistor MN0804_L comes into the ON state. At this time, since the high-voltage P-type transistor MP0802 remains in the ON state, the potential of the node N0804 falls to a voltage value V1 obtained by dividing the voltage VCCH by the ON-resistance of the high-voltage P-type transistor MP0802 and the sum of the ON-resistances of the high-voltage N-type transistor MN0802 and the low-voltage N-type transistor MN0804_L which are connected in series to each other (3 of FIG. 9). When the potential of the node N0804 becomes VCCH−VthP (VthP represents the threshold voltage of the high-voltage P-type transistor) or lower, the node N0803 comes into the ON state and when the potential of the node N0804 becomes the threshold voltage of the inverter INV0803 or lower, the output signal OUT_H becomes "H_h" level (4 of FIG. 9). When the node N0803 comes into the ON state, since the high-voltage P-type transistors MP0803 and MP0804 which are connected in series to each other both come into the ON state, the node N0803 is charged up to the voltage VCCH (5 of FIG. 9). When the node N0803 comes into the "H_h" level, the high-voltage P-type transistor MP0802 comes into the OFF state and the node N0804 is completely discharged to 0 V (6 of FIG. 9), and in the RS flip-flop consisting of the NOR gates NOR0801 and NOR0802, the node N0805 is set to the "H_h" level and the node N0806 is set to the "L" level (7, 8 of FIG. 9). When the node N0805 comes into the "H_h" level, the high-voltage P-type transistor MP0804 comes into the OFF state. Since the high-voltage P-type transistor MP0801 is in the ON state at the time when the potential of the node N0804 becomes VCCH−VthP (VthP represents the threshold voltage of the high-voltage P-type transistor) or lower (3 of FIG. 9), the "H_h" level of the node N0803 is kept. The above is a series of operation of the level shifting circuit, which is caused by the change of the input signal IN_L from the "L" level to the "H_l" level.

An operation in the case where the input signal IN_L changes from the "H_l" level to the "L" level (t1 of FIG. 9) is the same as above, and potential changes of the respective nodes are shown by 11 to 18 of FIG. 9.

Thus, in the fourth preferred embodiment, since gate voltages of the high-voltage N-type transistors MN0801 and MN0802 are always higher than the threshold voltage (VthN) thereof and discharges of the nodes N0803 and N0804 are controlled by the low-voltage N-type transistors MN0803_L and MN0804_L, it is possible to avoid the problem that the node N0803 or the node N0804 is not discharged even if the voltage VCCL becomes as low as the threshold voltage VthN. Further, since a voltage equal to or higher than the breakdown voltage of the low-voltage N-type transistors is not applied to the nodes N0809 nor N0810, it is possible to avoid breakage of the low-voltage N-type transistors MN0803_L and MN0804_L even if the difference between the voltage VCCH and the voltage VCCL becomes large.

Further, since the ON-resistances of the high-voltage P-type transistors MP0801 and MP0802 are set extremely high, the through current which flows when the high-voltage P-type transistor MP0801, the high-voltage N-type transistor MN0801 and the low-voltage N-type transistor MN0803_L come into the ON state at the same time or when the high-voltage P-type transistor MP0802, the high-voltage N-type transistor MN0802 and the low-voltage N-type transistor MN0804_L come into the ON state at the same time can be made extremely small. Moreover, even when the difference between the voltage VCCL and the voltage VCCH becomes large, it is possible to reduce the value of V1. Further, since no through current flows through the high-voltage P-type transistors MP0803 and MP0804, which are connected in series to each other, for charging the nodes N0803 and N0804, or through the high-voltage P-type transistors MP0805 and MP0806, it is possible to optimize the ON-resistances thereof with a high priority given to charging speed and avoid an increase in delay time caused by lower power consumption.

What is claimed is:

1. A level shifting circuit comprising:
a discharging circuit to perform a discharge of a first node and a second node with a complementary input signal using a first voltage source as a power supply; and
a charging circuit to perform a charge of said first node according to a logical level of said second node and to perform a charge of said second node according to a logical level of said first node,
wherein said discharging circuit comprises:
a first high-voltage N-type transistor and a second high-voltage N-type transistor whose gates are biased respectively in a predetermined voltage and whose drains are connected to said first and second nodes respectively; and
a first low-voltage N-type transistor and a second low-voltage N-type transistor whose drains are connected to sources of said first and second high-voltage N-type transistors respectively, whose gates are connected to said complementary input signal and whose sources are grounded respectively, wherein said charging circuit comprises:
  a first high-voltage P-type transistor whose drain is connected to said first node, whose gate is connected to said second node and whose source is connected to a second voltage source;
  a second high-voltage P-type transistor whose drain is connected to said second node, whose gate is connected to said first node and whose source is connected to said second voltage source;
  a first switching circuit and a second switching circuit connected in parallel to said first and second high-voltage P-type transistors respectively, to keep an OFF state at a stationary state when an input signal does not change; and
  a charging regulator circuit which charges said second node to the logic "H" by setting said second switching circuit to an ON state and thereafter brings back said second switching circuit to an OFF state when said first node is changed from the logic "H" to the logic "L" by a change of said input signal, and which charges said first node to the logic "H" by setting said first switching circuit to an ON state and thereafter brings back said first switching circuit to an OFF state when said second node is changed from the logic "H" to the logic "L" by the change of said input signal; and wherein said predetermined voltage is set to an intermediate voltage between a threshold voltage of said first and second high-voltage N-type transistors and a breakdown voltage of said first and second low-voltage N-type transistors.

2. The level shifting circuit according to claim 1, wherein said first and second switching circuits comprise a third high-voltage P-type transistor and a fourth high-voltage P-type transistor respectively, whose drains are connected to said first and second nodes respectively, and whose sources are connected to said second voltage source, and wherein said charging regulator circuit comprises:
  a RS flip-flop consisting of a first NOR gate whose input terminal is connected to said second node and a second NOR gate whose input terminal is connected to said first node;
  a third NOR gate whose input terminal is connected to an output of said first NOR gate and said second node;
  a fourth NOR gate whose input terminal is connected to an output of said second NOR gate and said first node;
  a first inverter whose input terminal is connected to an output of said third NOR gate and whose output terminal is connected to a gate of said third high-voltage P-type transistor; and
  a second inverter whose input terminal is connected to an output of said fourth NOR gate and whose output terminal is connected to a gate of said fourth high-voltage P-type transistor.

3. The level shifting circuit according to claim 1, wherein said first and second switching circuits are made up of a third high-voltage P-type transistor and a fourth high-voltage P-type transistor respectively, whose drains are connected to said first and second nodes respectively, and whose sources are connected to said second voltage source respectively, and wherein said charging regulator circuit comprises:
  a first inverter whose input terminal is connected to said second node;
  a second inverter whose input terminal is connected to said first node;
  a RS flip-flop comprising a first NAND gate and a second NAND gate whose input terminals are connected to said first and second inverters respectively;
  a third NAND gate whose input terminal is connected to an output of said first NAND gate and an output of said first inverter and whose output terminal is connected to a gate of said third high-voltage P-type transistor; and
  a fourth NAND gate whose input terminal is connected to an output of said second NAND gate and an output of said second inverter and whose output terminal is connected to a gate of said fourth high-voltage P-type transistor.

4. The level shifting circuit according to claim 1, wherein
said first switching circuit comprises a third high-voltage P-type transistor and a fourth high-voltage P-type transistor which are connected in series to each other,
said second switching circuit comprises a fifth high-voltage P-type transistor and a sixth high-voltage P-type transistor which are connected in series to each other,
said charging regulator circuit comprises a RS flip-flop consisting of a first NOR gate whose input terminal is connected to said second node and a second NOR gate whose input terminal is connected to said first node,
gates of said third and fourth high-voltage P-type transistors are connected to said second node and an output of said first NOR gate respectively, and
gates of said fifth and sixth high-voltage P-type transistors are connected to said first node and an output of said second NOR gate respectively.

* * * * *